(12) United States Patent
Lee

(10) Patent No.: US 9,165,939 B2
(45) Date of Patent: Oct. 20, 2015

(54) METHOD FOR FABRICATING NONVOLATILE MEMORY DEVICE

(75) Inventor: Nam-Jae Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 294 days.

(21) Appl. No.: 13/606,495

(22) Filed: Sep. 7, 2012

(65) Prior Publication Data

US 2013/0095635 A1   Apr. 18, 2013

(30) Foreign Application Priority Data

Oct. 18, 2011   (KR) .................. 10-2011-0106608

(51) Int. Cl.
| | |
|---|---|
| H01L 21/8238 | (2006.01) |
| H01L 21/76 | (2006.01) |
| H01L 21/3205 | (2006.01) |
| H01L 21/4763 | (2006.01) |
| H01L 27/115 | (2006.01) |
| H01L 27/06 | (2006.01) |

(52) U.S. Cl.
CPC ...... *H01L 27/11546* (2013.01); *H01L 27/0629* (2013.01); *H01L 27/11529* (2013.01)

(58) Field of Classification Search
None
See application file for complete search history.

(56) References Cited

U.S. PATENT DOCUMENTS

| | | | |
|---|---|---|---|
| 6,096,602 A * | 8/2000 | Kim et al. .................... | 438/257 |
| 2005/0287742 A1* | 12/2005 | Kang ........................... | 438/257 |
| 2007/0133289 A1* | 6/2007 | Ma et al. ................... | 365/185.17 |
| 2009/0298248 A1* | 12/2009 | Fung ............................ | 438/296 |

* cited by examiner

*Primary Examiner* — Calvin Choi
(74) *Attorney, Agent, or Firm* — IP & T Group LLP

(57) ABSTRACT

A method for fabricating a nonvolatile memory device includes forming a first insulation layer and a first conductive layer on a substrate including a first region and a second region, forming a first isolation trench in the first region by etching the first conductive layer, the first insulation layer, and the substrate, forming a first isolation layer filled in the first isolation trench, forming a second insulation layer and a conductive capping layer, etching the capping layer and the second insulation layer, forming a second conductive layer, and forming first gate patterns by etching the second conductive layer, the capping layer, the second insulation layer, the first conductive layer, and the first insulation layer of the first region, and forming a second isolation trench in the second region by etching the second conductive layer, the first conductive layer, the first insulation layer, and the substrate.

22 Claims, 13 Drawing Sheets

METHOD FOR FABRICATING NONVOLATILE MEMORY DEVICE

CROSS-REFERENCE TO RELATED APPLICATIONS

The present application claims priority of Korean Patent Application No. 10-2011-0106608, filed on Oct. 18, 2011, which is incorporated herein by reference in its entirety.

BACKGROUND

1. Field

Exemplary embodiments of the present invention relate to a method for fabricating a nonvolatile memory device, and more particularly, to a method for fabricating a nonvolatile memory device including a cell region and a peripheral circuit region having different pattern densities.

2. Description of the Related Art

A nonvolatile memory device represents a memory device that retains stored data even if the supply of power is interrupted, and for example, an NAND type flash memory device and the like have been extensively used.

A nonvolatile memory device includes a cell region and a peripheral circuit region. The cell region includes a plurality of memory cells in order to stores data. The peripheral circuit region includes a driving circuit, a voltage generation circuit and the like for the operation of the nonvolatile memory device, and various unit elements for the configuration of these circuits, for example, transistors, resistors and the like are formed therein. A method for fabricating the nonvolatile memory device will be described below.

FIGS. 1 to 4 are cross-sectional views illustrating a method for fabricating a conventional nonvolatile memory device.

Referring to FIG. 1, a cell region C and a peripheral circuit region P are defined in a substrate 100. The cell region C represents a region, where a plurality of memory cells are to be formed, and each memory cell includes a tunnel insulation layer, a floating gate, a charge blocking layer, and a control gate which are sequentially stacked on the substrate 100. A first peripheral circuit region P1 of the peripheral circuit region P represents a region where a peripheral circuit transistor is to be formed, and a gate (hereinafter, referred to as a peripheral circuit gate) of the peripheral circuit transistor is formed of substantially the same material layer as the floating gate and the control gate of the cell region C. That is, the peripheral circuit gate may include a floating gate and a control gate, which are directly coupled to each other, so that the floating gate and the control gate are electrically connected to each other. A second peripheral circuit region P2 of the peripheral circuit region P represents a region, where a resistor is to be formed, and the resistor is formed of substantially the same material layer as the floating gate of the cell region C.

A first insulation layer 110 for the tunnel insulation layer and a first conductive layer 120 for the floating gate are formed on the substrate 100.

Referring to FIG. 2, the first conductive layer 120, the first insulation layer 110, and the substrate 100 are etched using a mask pattern (not illustrated) that exposes an isolation region, so that isolation trenches and active regions A1 to A3 defined by the isolation trenches are formed in the cell region C, and the first and second peripheral circuit regions P1 and P2. The first conductive layer 120 and the first insulation layer 110 etched in the above process are indicated by reference numerals 120A and 110A, respectively.

An insulation layer is filled in the isolation trenches to form an isolation layer 130. In detail, the insulation layer with a sufficient thickness to fill the isolation trenches is formed, and a chemical mechanical polishing (CMP) process may be performed until the first conductive layer 120A is exposed, thereby forming the isolation layer 130.

Referring to FIG. 3, a mask pattern 140 covering the peripheral circuit region P is formed, and a part of the isolation layer 130 of the cell region C exposed by the mask pattern 140 is removed. A partially removed isolation layer 130 of the cell region C is indicated by reference numeral 130A. As a result of the above process, in the cell region C, the upper portion of the first conductive layer 120A protrudes from the isolation layer 130A. The reason for performing the above process is that a coupling ratio increases by increasing a contact area between the control gate and the floating gate.

Referring to FIG. 4, a second insulation layer 150 for a charge blocking layer is formed over the process resultant after the mask pattern 140 is removed, and the second insulation layer 150 has a region (hereinafter, referred to as an open region) O1 that exposes a part of the first conductive layer 120A of the first peripheral circuit region P1. The reason for forming the open region O1 is that the floating gate and the control gate of the peripheral circuit gate formed in the first peripheral circuit region P1 are prevented from being disconnected from each other by the second insulation layer 150, and the floating gate and the control gate are electrically connected to each other.

A second conductive layer 160 for a control gate is formed on the second insulation layer 150 having the open region O1.

Although not illustrated in the drawings, the first insulation layer 110A, the first conductive layer 120A, the second insulation layer 150, and the second conductive layer 160 of the cell region C are patterned, thereby forming the above-mentioned memory cells. Furthermore, the first conductive layer 120A, the second insulation layer 150 having the open region O1, and the second conductive layer 160 of the first peripheral circuit region P1 are patterned, thereby forming the above-mentioned peripheral circuit gate. Furthermore, the second conductive layer 160 of the second peripheral circuit region P2 is selectively etched, thereby forming the above-mentioned resistor formed only of the first conductive layer 120A.

However, the above-mentioned fabricating method has the following concerns.

First, in the process of FIG. 2, the isolation trench formation process and the process for forming the isolation layer 130 filled in the isolation trenches may be performed to the cell region C, the first peripheral circuit region P1, and the second peripheral circuit region P2, simultaneously. Here, the pattern density of the cell region C may be higher than that of the peripheral circuit region P. In other words, the active region A1 and the isolation layer 130 of the cell region C may be densely formed as compared with the active regions A2 and A3 and the isolation layer 130 of the peripheral circuit region P. Due to a loading effect caused by such pattern density difference, it may cause many differences between the cell region C and the peripheral circuit region P, for example, in an etching speed of the etching process performed in order to form the isolation trenches, in a filling thickness of the insulation layer filled in order to form the isolation layer 130, and in a CMP speed of the CMP process performed in order to form the isolation layer 130.

Furthermore, in the process of FIG. 3, in order to allow the first conductive layer 120A to protrude from the isolation layer 130A only in the cell region C, an additional process for forming the mask pattern 140 covering the peripheral circuit region P may be required. Since the mask pattern formation process passes through a series of steps such as photoresist coating, exposure, and development steps, the cost, time, and degree of difficulty in the total process may be increased as the number of the mask pattern formation processes may be increased.

In addition, after the isolation trenches are formed in the process of FIG. 2, an ion implantation process is further performed to the substrate 100 of the first peripheral circuit region P1 in order to improve a standby current of the peripheral circuit transistor. Such an ion implantation process is performed in the state that the mask pattern covering the cell region C and the second peripheral circuit region P2 has been formed. However, in the process for removing the mask pattern after the ion implantation process is performed, the first conductive layer 120A already formed in the cell region C may lean, which is called a leaning phenomenon. This is because the first conductive layer 120A already formed in the cell region C has a very small line width as compared with the peripheral circuit region P.

In this regard, a fabricating method of the nonvolatile memory device is being developed to address the above concerns.

SUMMARY

Exemplary embodiments of the present invention are directed to a method for fabricating a nonvolatile memory device, which may ensure uniformity in process and reduce the process time, cost, difficulty, and fail.

In accordance with an exemplary embodiment of the present invention, a method for fabricating a nonvolatile memory device includes forming a first insulation layer and a first conductive layer on a substrate including a first region and a second region, forming a first isolation trench in the first region by selectively etching the first conductive layer, the first insulation layer, and the substrate of the first region, forming a first isolation layer filled in the first isolation trench; forming a second insulation layer and a conductive capping layer on the first isolation layer and the first conductive layer, etching the capping layer and the second insulation layer of the second region; forming a second conductive layer on a resultant structure, and forming first gate patterns by selectively etching the second conductive layer, the capping layer, the second insulation layer, the first conductive layer, and the first insulation layer of the first region, and forming a second isolation trench in the second region by selectively etching the second conductive layer, the first conductive layer, the first insulation layer, and the substrate of the second region.

In accordance with an exemplary embodiment of the present invention, a method for fabricating a nonvolatile memory device includes forming a first insulation layer for a tunnel insulation layer and a first conductive layer for a floating gate on a substrate including a cell region, a first peripheral circuit region, and a second peripheral circuit region, forming a first isolation trench in the cell region by selectively etching the first conductive layer, the first insulation layer, and the substrate of the cell region, forming a first isolation layer filled in the first isolation trench, forming a second insulation layer for a charge blocking layer and a conductive capping layer on the first isolation layer and the first conductive layer, removing the capping layer and the second insulation layer of the first peripheral circuit region, while patterning the capping layer and the second insulation layer of the second peripheral circuit region to be positioned in an active region, forming a second conductive layer for a control gate on a resultant structure, and forming first gate patterns by selectively etching the second conductive layer, the capping layer, the second insulation layer, the first conductive layer, and the first insulation layer of the cell region, and forming a second isolation trench in the first and second peripheral circuit regions by selectively etching the second conductive layer, the first conductive layer, the first insulation layer, and the substrate of the first and second peripheral circuit regions.

In accordance with an exemplary embodiment of the present invention, a method for fabricating a nonvolatile memory device includes forming a first insulation layer and a first conductive layer on a substrate including a first region and a second region, forming a first isolation layer in the substrate of the first regions, forming a second insulation layer and a conductive capping layer on the first isolation layer and the first conductive layer, etching the capping layer and the second insulation layer of the second region, forming a second conductive layer on a resultant structure, and forming first gate patterns in the first region and a second isolation trench in the second regions by selectively etching the second conductive layer, the capping layer, the second insulation layer, the first conductive layer, and the first insulation layer of the first region and the second conductive layer, the first conductive layer, the first insulation layer, and the substrate of the second region.

DETAILED DESCRIPTION

Figure 1:
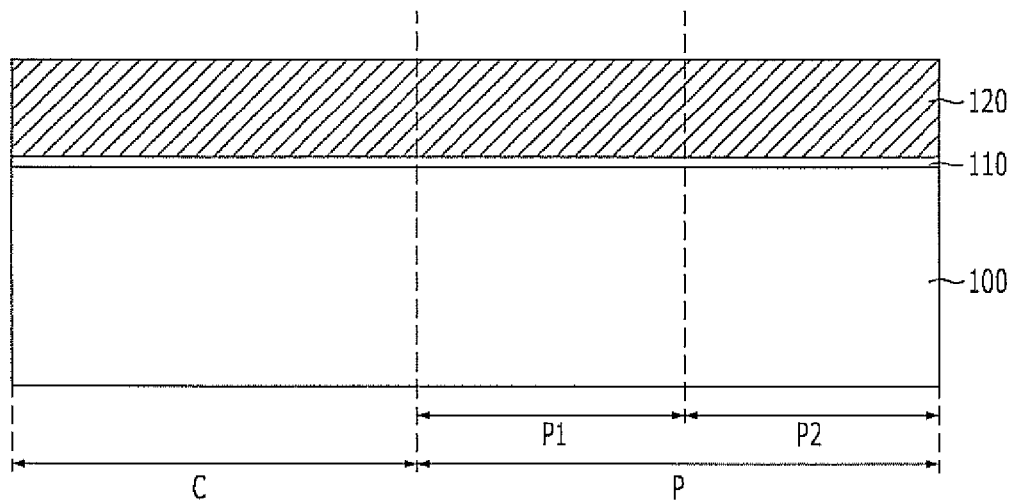
FIGS. 1 to 4 are cross-sectional views illustrating a method for fabricating a conventional nonvolatile memory device.
Figure 2:
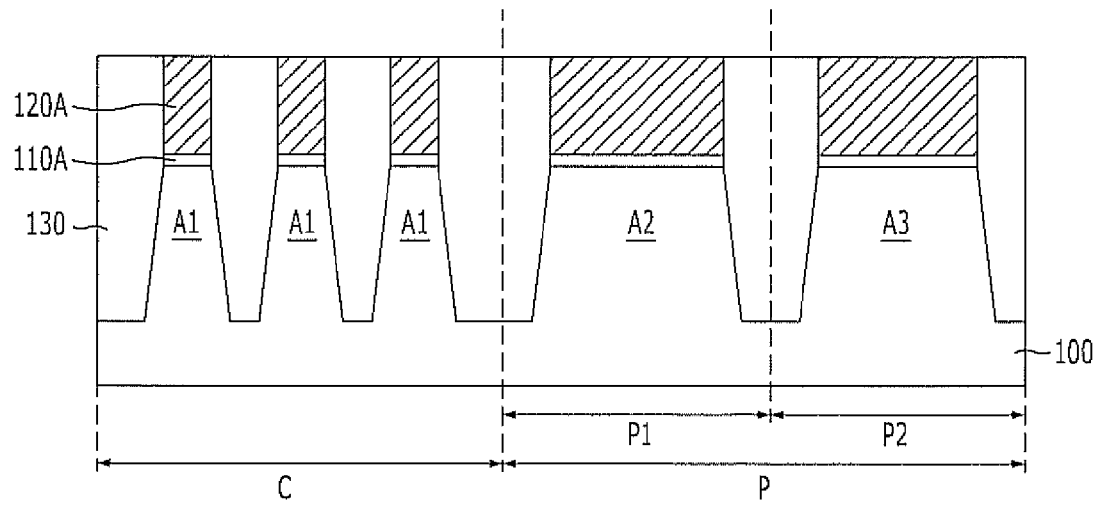

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 5:
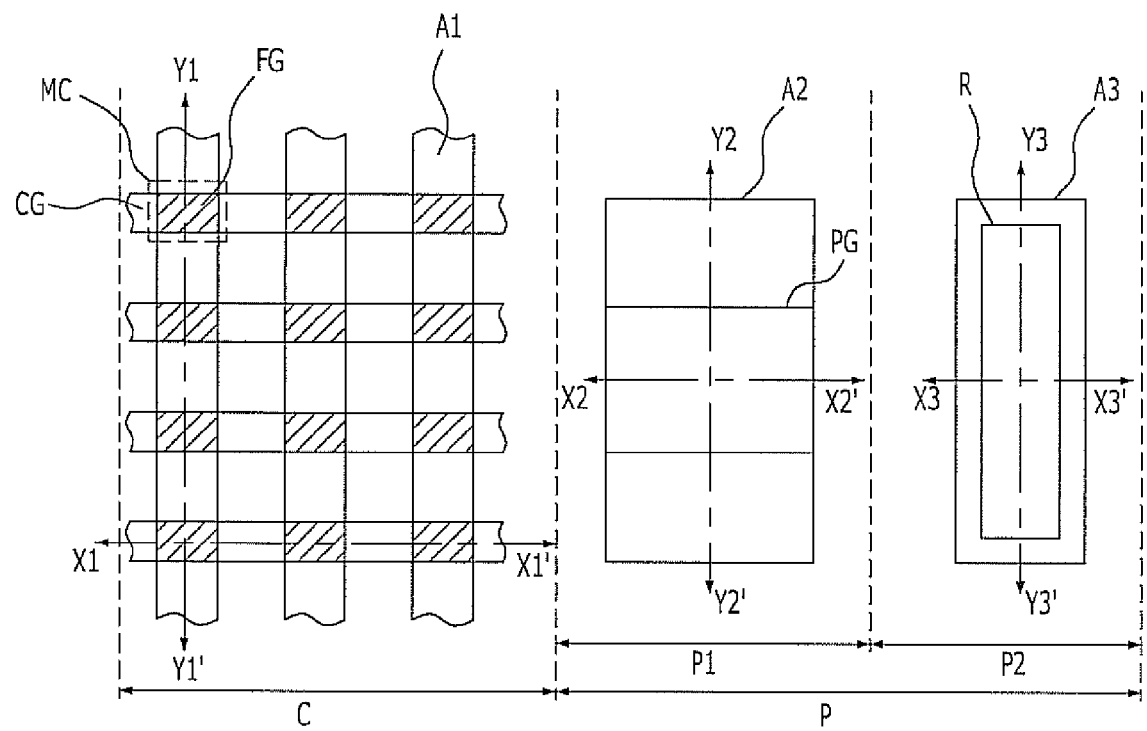
FIG. 5 is a plan view illustrating a nonvolatile memory device in accordance with an exemplary embodiment of the present invention.

FIG. 5 is a plan view illustrating a nonvolatile memory device in accordance with an exemplary embodiment of the present invention.

Referring to FIG. 5, the nonvolatile memory device includes a cell region C where a plurality of memory cells are to be formed, and a peripheral circuit region P where a plurality of unit elements, for example, peripheral circuit transistors or resistors are to be formed. In the exemplary embodiment of the present invention, specifically, a region where peripheral circuit transistors are to be formed will be referred to as a first peripheral circuit region P1, and a region where resistors are to be formed will be referred to as a second peripheral circuit region P2. The cell region C, the first peripheral circuit region P1, and the second peripheral circuit region P2 are arranged in a row. However, the present invention is not limited thereto. The first and second peripheral circuit regions P1 and P2 just are arranged around the cell region C.

First, the cell region C will be described. In a semiconductor substrate, a plurality of active regions A1 extend in one direction Y1-Y1' while being arranged in parallel to one another. On the semiconductor substrate, a plurality of control gates CG extend in a direction X1-X1' across the active regions A1 while being arranged in parallel to one another. A floating gate FG having an island shape is formed between the control gate CG and the active region A1 at the intersections thereof. A tunnel insulation layer (not illustrated) is interposed between the floating gates FG and the semiconductor substrate, and a charge blocking layer (not illustrated) is interposed between the floating gates FG and the control gates CG. One floating gate FG, the tunnel insulation layer below the floating gate FG, the charge blocking layer above the floating gate FG, and the control gate CG making contact with the floating gate FG constitute a unit memory cell MC.

Then, the first peripheral circuit region P1 will be described. An active region A2 having a bar shape is formed in the semiconductor substrate, and a peripheral circuit gate PG is formed on the semiconductor substrate across the active region A2. A junction region is formed in the active regions A2 at both sides of the peripheral circuit gate PG. A gate dielectric layer (not illustrated) is interposed between the peripheral circuit gate PG and the active region A2. The peripheral circuit gate PG, the junction region, and the gate dielectric layer constitute a peripheral circuit transistor. The shape of the peripheral circuit gate PG, the shape of the active region A2, and the like are not limited to the above exemplary embodiment, but may be variously changed.

Last, the second peripheral circuit region P2 will be described. An active region A3 having a bar shape is formed in the semiconductor substrate, and a resistor R is formed on the active region A3. The resistor R may be formed of substantially the same material layer as the floating gate FG of the cell region C. An insulation layer may be interposed between the resistor R and the active region A3, and it may also be formed on the resistor R. The shape of the resistor R, the shape of the active region A3, and the like are not limited to the above exemplary embodiment, but may be variously changed.

A method for fabricating the nonvolatile memory device as described above will be described in detail with reference to FIGS. 6 to 20.

FIGS. 6 to 16 are cross-sectional views illustrating the method for fabricating the nonvolatile memory device in accordance with the embodiment of the present invention. Specifically, in FIGS. 6 to 12, the cell region C indicates a section taken along line X1-X1' of FIG. 5, the first peripheral circuit region P1 indicates a section taken along line X2-X2' of FIG. 5, and the second peripheral circuit region P2 indicates a section taken along line X3-X3' of FIG. 5. In FIGS. 13 to 16, the cell region C indicates a section taken along line Y1-Y1' of FIG. 5, the first peripheral circuit region P1 indicates a section taken along line Y2-Y2' of FIG. 5, and the second peripheral circuit region P2 indicates a section taken along line Y3-Y3' of FIG. 5.

Figure 6:
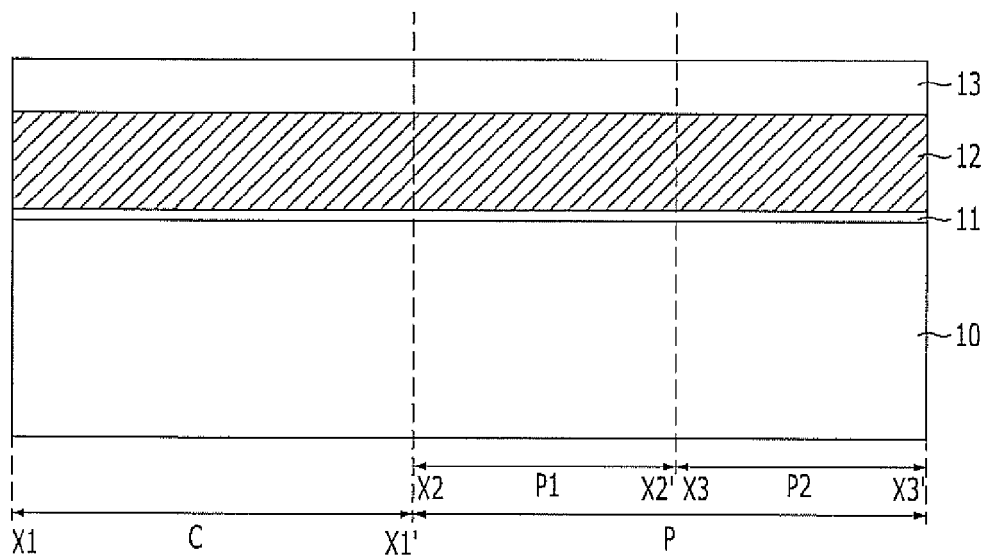
FIGS. 6 to 16 are cross-sectional views illustrating a method for fabricating a nonvolatile memory device in accordance with an exemplary embodiment of the present invention.

Referring to FIG. 6, the cell region C, the first peripheral circuit region P1, and the second peripheral circuit region P2 are defined in a substrate 10. The substrate 10 may include a semiconductor substrate such as a silicon substrate.

A first insulation layer 11 for a tunnel insulation layer and a first conductive layer 12 for a floating gate are formed on the substrate 10, and a first hard mask layer 13 is formed. The first insulation layer 11, for example, may include an oxide layer, the first conductive layer 12, for example, may include a polysilicon layer doped with impurities, and the first hard mask layer 13 may include an insulation layer such as a nitride layer or an oxide layer.

Figure 7:
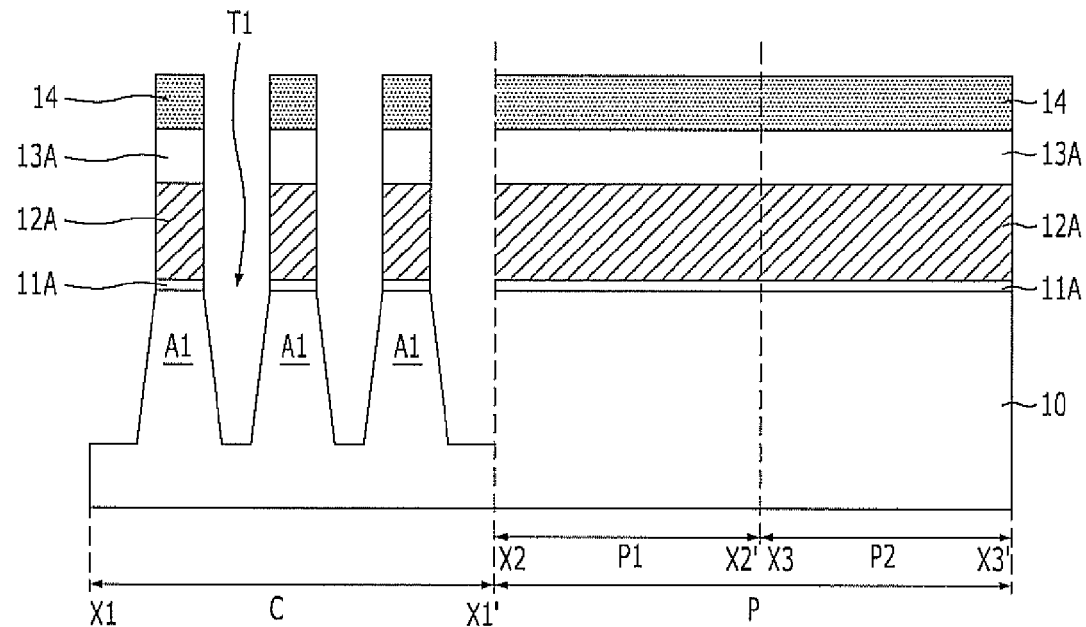

Referring to FIG. 7, a mask pattern 14 is formed on the first hard mask layer 13 to cover the peripheral circuit region P while exposing an isolation region of the cell region C. The mask pattern 14 may be formed through photoresist coating, exposure, and development processes.

The first hard mask layer 13 is etched using the mask pattern 14 as an etching mask to form a first hard mask pattern 13A, and the first conductive layer 12, the first insulation layer 11, and the substrate 10 are etched using the mask pattern 14 and/or the first hard mask pattern 13A as an etching mask to form isolation trenches T1 and active regions A1 defined by the isolation trenches T1 in the cell region C. The first conductive layer 12 and the first insulation layer 11 etched in the above process are indicated by reference numerals 12A and 11A, respectively.

That is, differently from the conventional art, in the exemplary embodiment of the present invention, the isolation trenches T1 and the active regions A1 of the cell region C are first formed.

Figure 8:
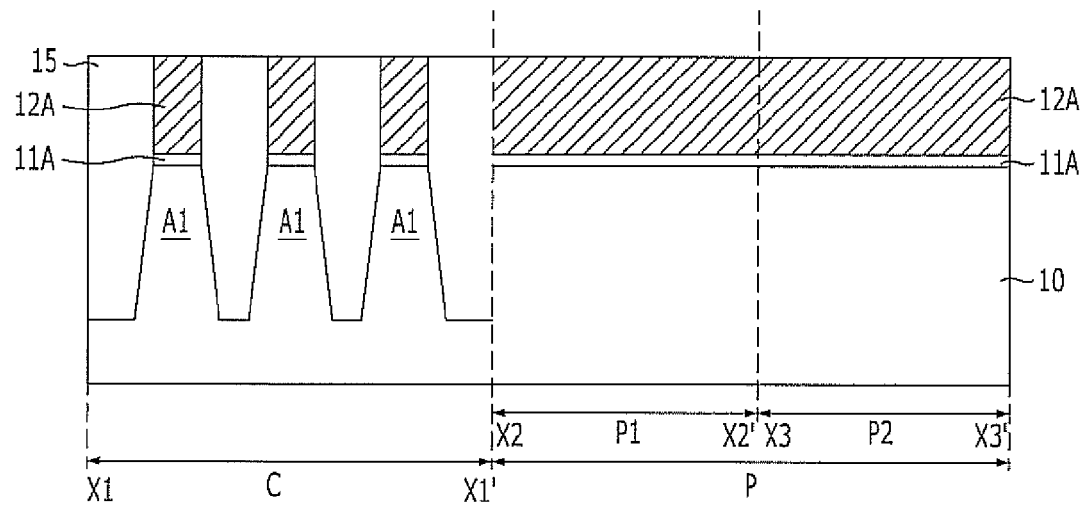

Referring to FIG. 8, an insulation layer (for example, an oxide layer) with a sufficient thickness to filling the isolation trenches T1 is formed on the process resultant of FIG. 7, and a planarization process (for example, a CMP process) is formed until the first conductive layer 12A is exposed, thereby forming an isolation layer 15. As described above, since the isolation trenches T1 have been formed only in the cell region C, the isolation layer 15 is also formed only in the cell region C.

Figure 9:
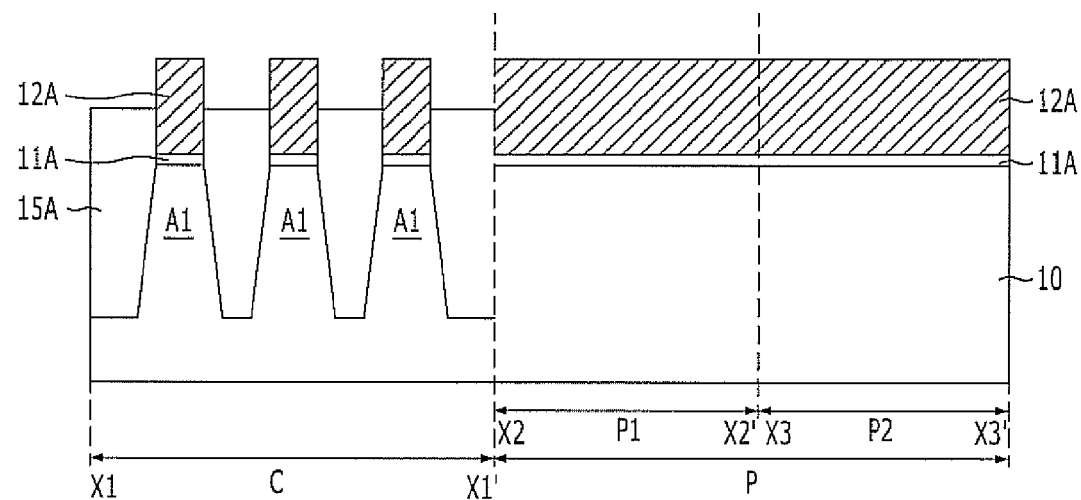

Referring to FIG. 9, an upper portion of the isolation layer 15 of the cell region C is removed. The isolation layer 15 with the upper portion removed is indicated by reference numeral 15A. As a result of the above process, the upper portion of the first conductive layer 12A of the cell region C protrudes from the isolation layer 15A. This is for increasing a coupling ratio by increasing a contact area between the floating gate and the control gate.

Figure 3:
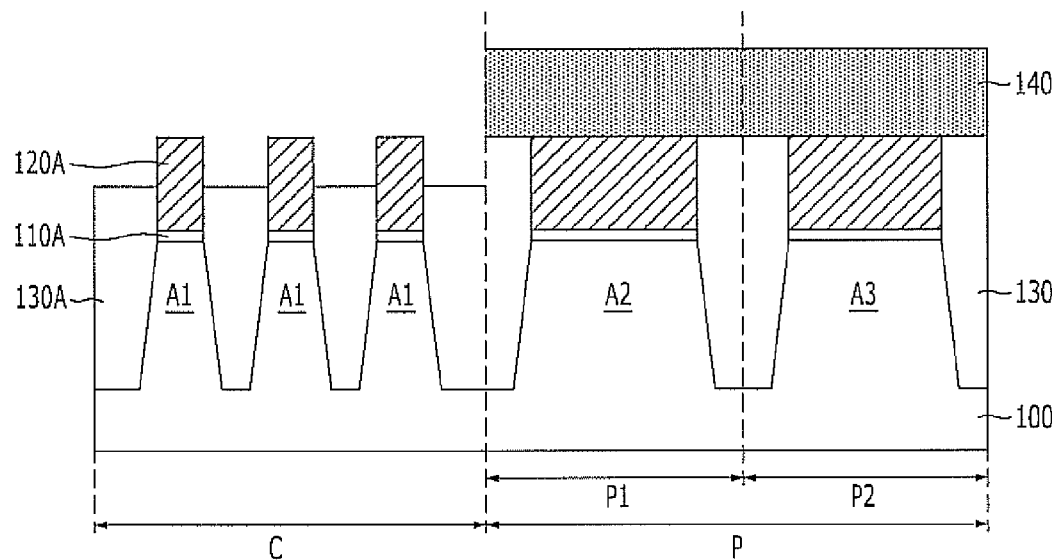
Figure 4:
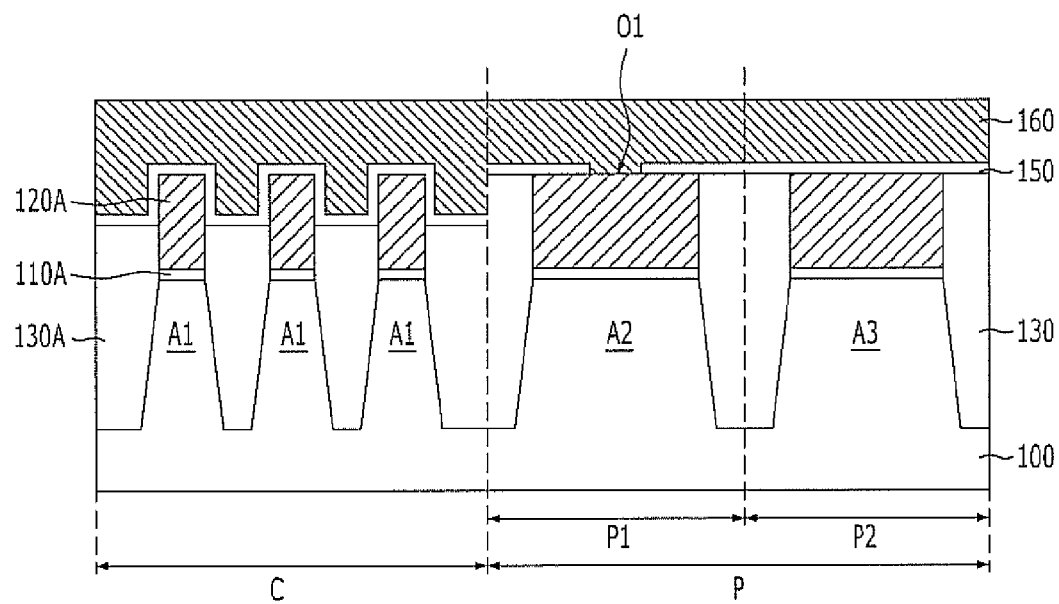

The process for removing the upper portion of the isolation layer 15 may be performed using the difference between the etch rate of the first conductive layer 12A and the etch rate of the isolation layer 15A without using an additional mask pattern formation process. For example, the process for removing the upper portion of the isolation layer 15 may be performed through an etching process using etchant solution or etching gas having a high etching rate to an oxide layer against a polysilicon layer. In the conventional art, since the isolation layer has been formed in the peripheral circuit region as well as the cell region, the mask pattern covering the peripheral circuit region is formed in order to prevent the isolation layer of the peripheral circuit region from being lost, and the upper portion of the isolation layer is removed (refer to FIG. 3). However, in the exemplary embodiment of the preset invention, since the isolation layer is not formed in the peripheral circuit region P, the process time, cost, and difficulty may be reduced by omitting a process for forming the mask pattern covering the peripheral circuit region.

Figure 10:
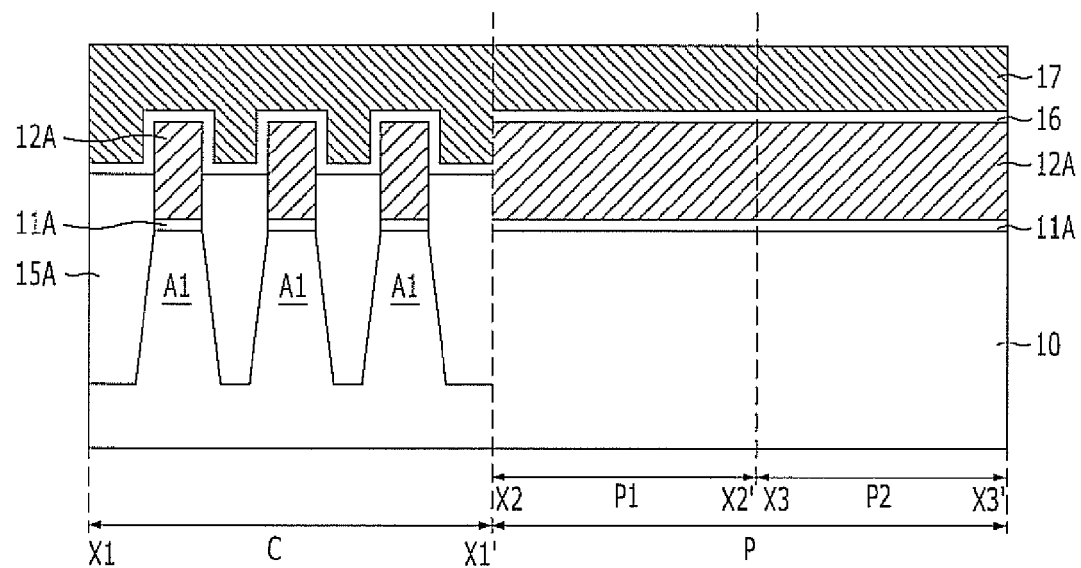

Referring to FIG. 10, a second insulation layer 16 for a charge blocking layer is formed over the process resultant of FIG. 9. The second insulation layer 16 may be formed along the surface of the substructure, and for example, may include an oxide-nitride-oxide (ONO) layer sequentially stacked.

A capping layer 17 is formed on the second insulation layer 16. The capping layer 17 protects the second insulation layer 16 in a subsequent process, and it may be formed of a conductive layer such as a polysilicon layer doped with impurities.

Figure 11:
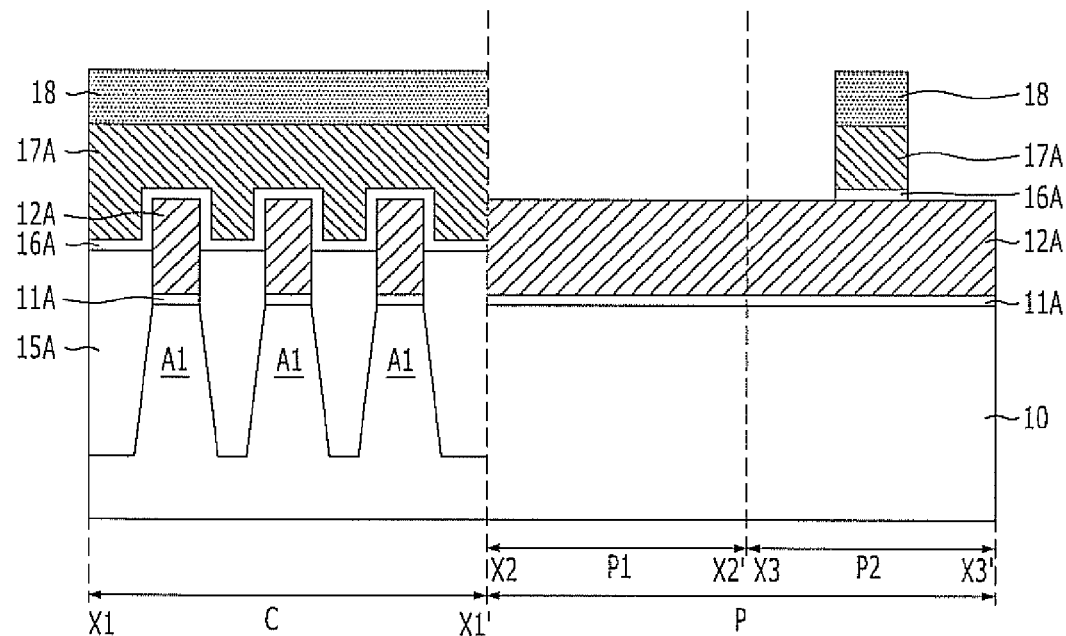

Referring to FIG. 11, a mask pattern 18 is formed on the capping layer 17 to cover the cell region C and a resistor formation region of the second peripheral circuit region P2 and expose a remaining region of the second peripheral circuit region P2 and the whole of the first peripheral circuit region P1. That capping layer 17 and the second insulation layer 16 are etched using the mask pattern 18 as an etching barrier. The etched capping layer 17 and the etched second insulation layer 16 are indicated by reference numerals 17A and 16A, respectively.

The reason for performing the above process is that the second insulation layer 16 is removed in order to form the peripheral circuit gate of the first peripheral circuit region P1. Specifically, in the conventional art, the second insulation layer of the first peripheral circuit region is partially removed. However, in the exemplary embodiment of the present invention, the whole of the second insulation layer 16 of the first peripheral circuit region P1 is removed. This is for forming gate patterns G1 of the cell region C while forming isolation trenches in the first peripheral circuit region P1 in a subsequent process of FIG. 13. This will be described in detail below.

Furthermore, the reason for performing the above process is because a resistor of the second peripheral circuit region P2 is formed only of the first conductive layer 12A and the second insulation layer 16 remains on the resistor.

Figure 12:
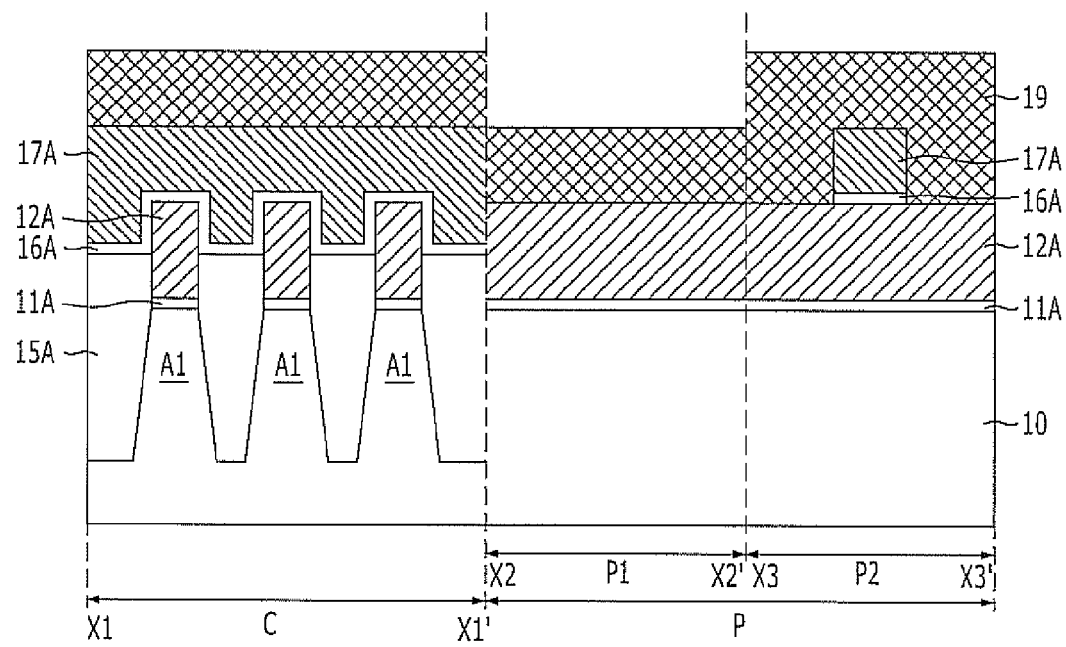

Referring to FIG. 12, a second conductive layer 19 for a control gate is formed on the first conductive layer 12A and the capping layer 17 exposed after the mask pattern 18 is removed. The second conductive layer 19, for example, may include a metal layer, a metal silicide layer, a polysilicon layer doped with impurities, and the like.

Figure 13:
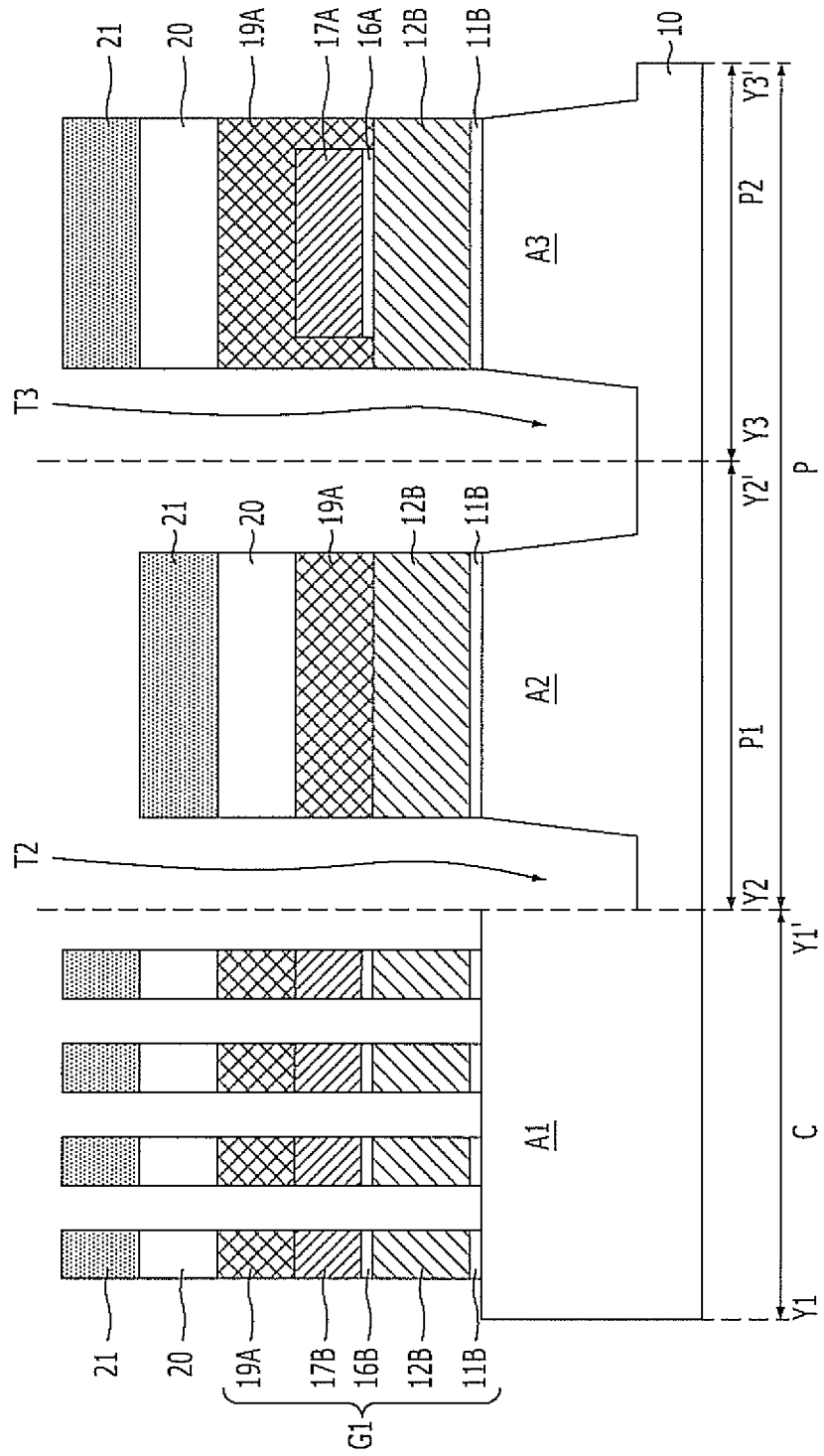

Referring to FIG. 13, a second hard mask layer such as a nitride layer is formed on the second conductive layer 19, and a mask pattern 21 is formed on the second hard mask layer to cover a region where the control gate of the cell region C is to be formed while exposing isolation regions of the peripheral circuit region P, that is, the isolation regions of the first and second peripheral circuit regions P1 and P2.

The second hard mask layer is etched using the mask pattern 21 as an etching mask to form a second hard mask pattern 20, and the second conductive layer 19, the capping layer 17A, the second insulation layer 16A, the first conductive layer 12A, and the first insulation layer 11A of the cell region C are etched using the mask pattern 21 and/or the second hard mask pattern 20 to form the gate patterns G1 in the cell region C. The etched second conductive layer 19, capping layer 17A, second insulation layer 16A, first conductive layer 12A, and first insulation layer 11A are indicated by reference numerals 19A, 17B, 16B, 12B, and 11B, respectively. As a result of the above process, a plurality of memory cells are formed in the cell region C, which include the second conductive layer 19A as a control gate and the first conductive layer 12B as a floating gate.

In the etching process for forming the gate patterns G1 of the cell region C, when the second conductive layer 19, the capping layer 17A, and the second insulation layer 16A are etched, the second conductive layer 19, the first conductive layer 12A, and the first insulation layer 11A of the first and second peripheral circuit regions P1 and P2 are also etched, respectively. Since the capping layer 17 and the second insulation layer 16 has been removed from the first peripheral circuit region P1 and the capping layer 17A and the second insulation layer 16A have small widths to overlap with the mask pattern 21 in the second peripheral circuit region P2 through the process of FIG. 11, the second conductive layer 19, the first conductive layer 12A, the first insulation layer 11A, and the substrate 10 are only etched by the mask pattern 21 in the first and second peripheral circuit regions P1 and P2. The substrate 10 exposed by etching the second conductive layer 19, the first conductive layer 12A, and the first insulation layer 11A of the first and second peripheral circuit regions P1 and P2 is also etched when the first conductive layer 12A and the first insulation layer 11A are etched in the etching process for forming the gate patterns G1 of the cell region C. As a consequence, isolation trenches T2 and T3 and active regions A2 and A3 defined by the isolation trenches T2 and T3 are formed in the substrate 10 of the first and second peripheral circuit regions P1 and P2. The etched second conductive layer 19, first conductive layer 12A, and first insulation layer 11A are indicated by reference numerals 19A, 12B, and 11B, respectively. Since the second insulation layer 16A and the capping layer 17A of the second peripheral circuit region P2 are positioned in the active region A3, the second insulation layer 16A and the capping layer 17A are not etched and remain as they are.

That is, differently from the conventional art, in the exemplary embodiment of the present invention, the process for forming the isolation trench T1 and the active region A1 of the cell region C is first performed, and the process for forming the isolation trenches T2 and T3 and the active regions A2 and A3 of the peripheral circuit region P is separately performed later. In this way, uniformity in the process may be prevented from being reduced due to a loading effect caused by the above-mentioned pattern density difference. In addition, since the process for forming the isolation trenches T2 and T3 and the active regions A2 and A3 of the peripheral circuit region P is performed together with the process for forming the gate patterns G1 of the cell region C, the total process may be simplified.

Figure 14:
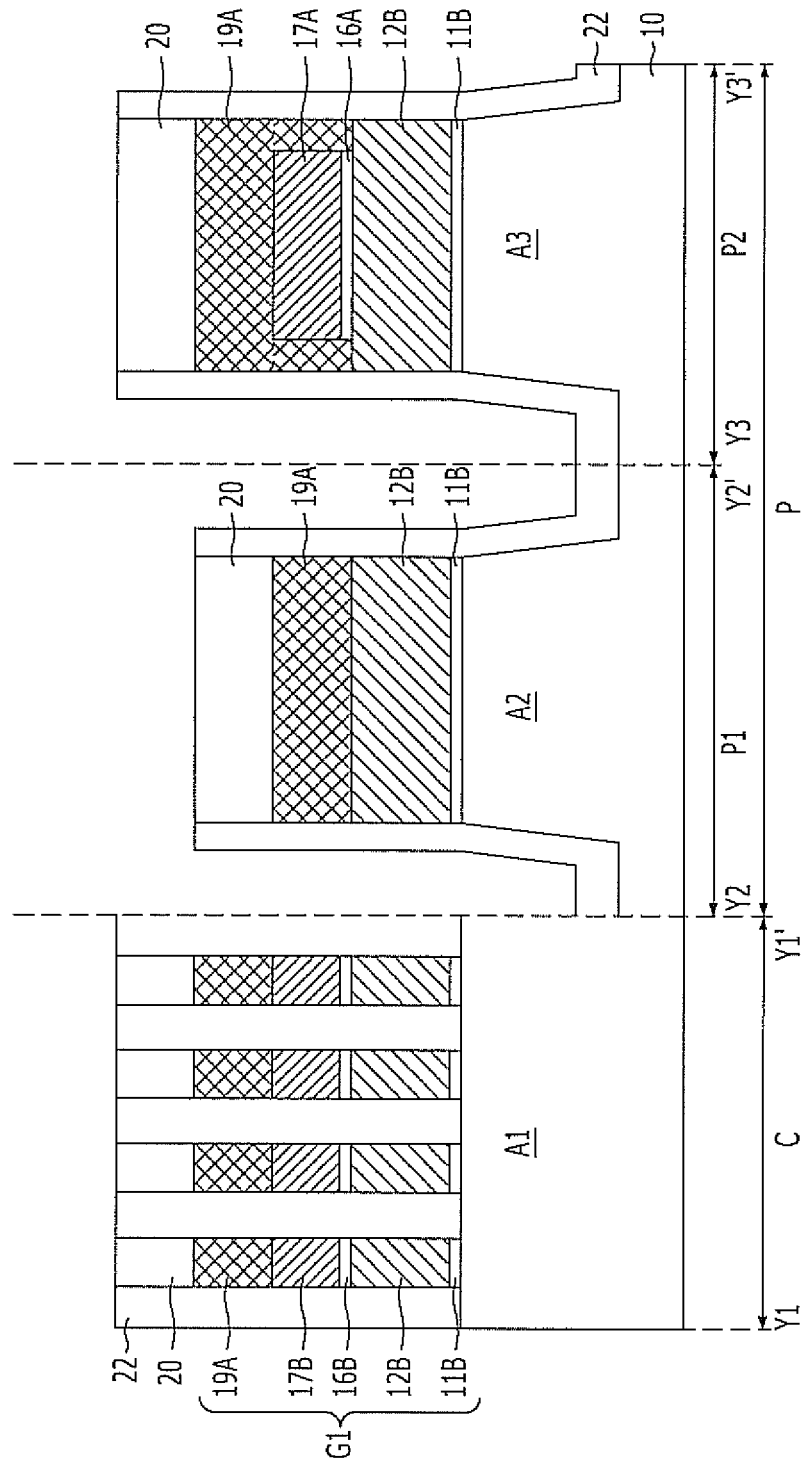

Referring to FIG. 14, an insulation layer (for example, an oxide layer) with a sufficient thickness to filling gaps between the gate patterns G1 of the cell region C is formed on the process resultant after the mask pattern 21 is removed, and a planarization process (for example, a CMP process) is performed until the second hard mask pattern 20 is exposed, thereby forming an insulation layer 22.

At this time, since the isolation trenches T2 and T3 have been formed in the first and second peripheral circuit regions P1 and P2, the insulation layer 22 is formed in the isolation trenches T2 and T3 to constitute an isolation layer. FIG. 14 illustrates that the insulation layer 22 fills a part of the isolation trenches T2 and T3. However, the present invention is not limited thereto. For example, the insulation layer 22 may completely fill the isolation trenches T2 and T3.

The insulation layer 22 formed as a result of the above process may isolate the gate patterns G1 in the cell region C from each other, and it serve as an isolation layer in the peripheral circuit region P. That is, as compared with the conventional art, the isolation layer may be formed in the peripheral circuit region P without adding any process.

Figure 15:
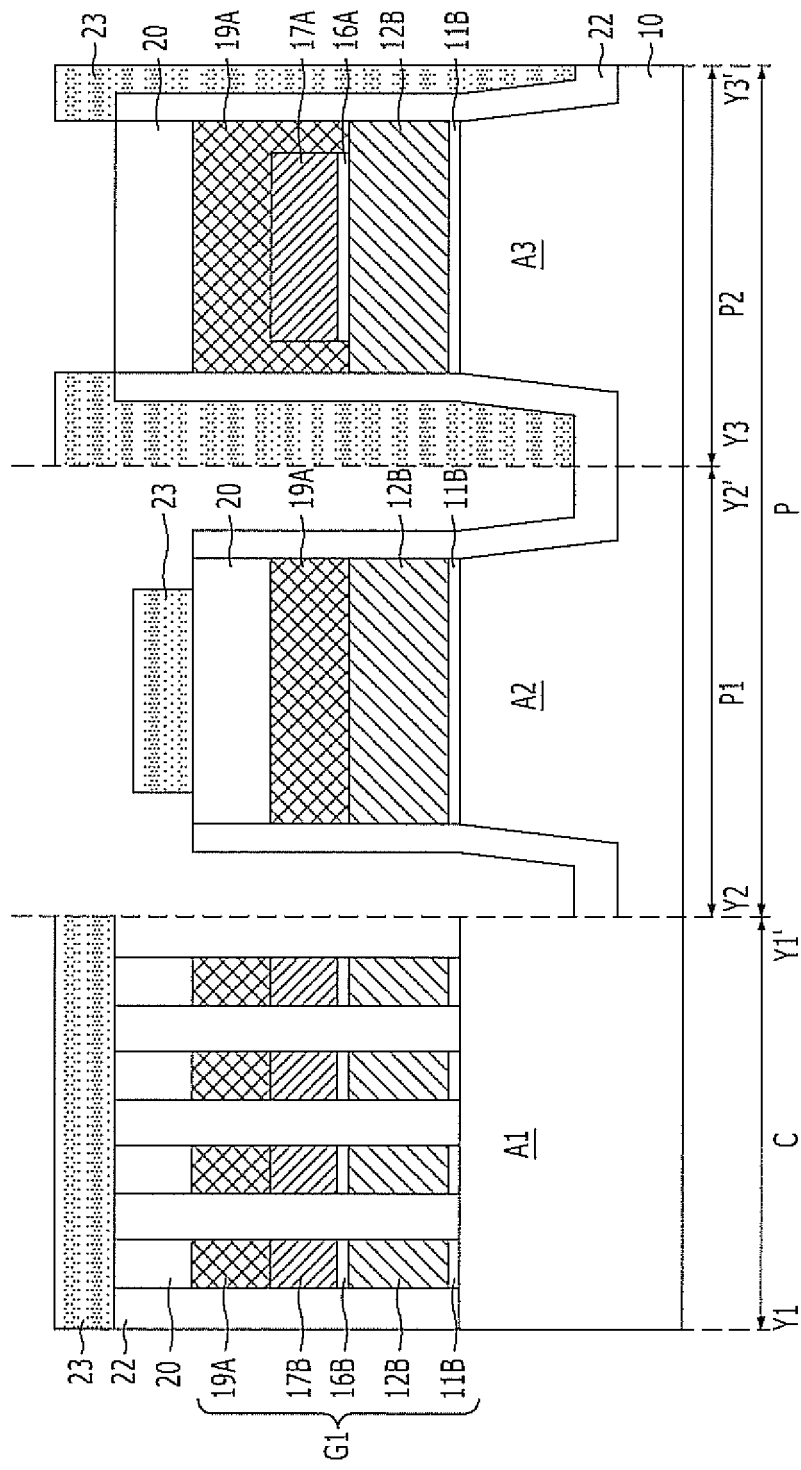

Referring to FIG. 15, a mask pattern 23 is formed on the process resultant of FIG. 14 to cover the cell region C and a region where a peripheral circuit gate of the first peripheral circuit region P1 is to be formed and expose the active region A3 in the second peripheral circuit region P2 while covering a remaining region therein.

Figure 16:
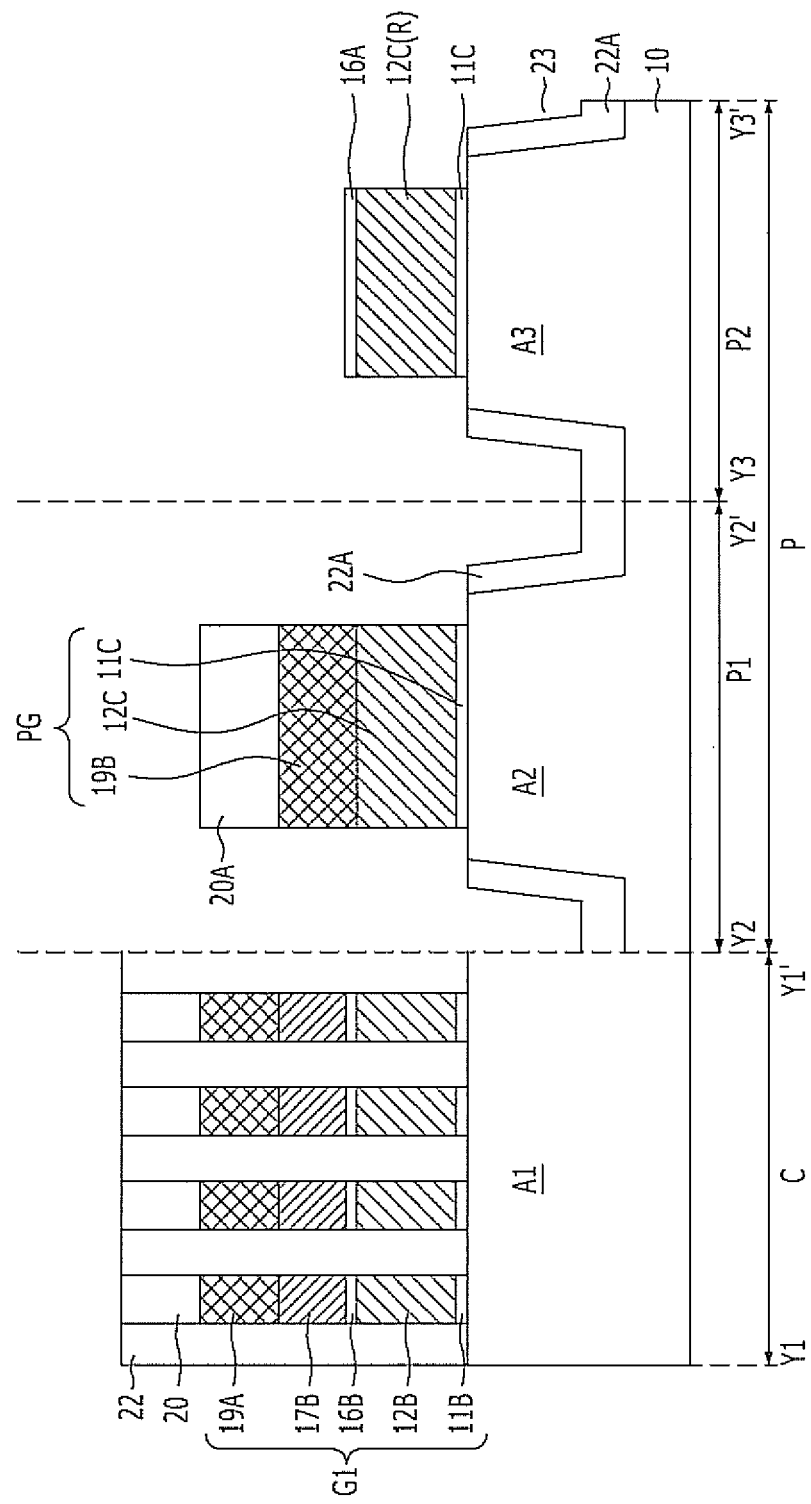

Referring to FIG. 16, the second hard mask pattern 20, the second conductive layer 19A, the first conductive layer 12B, and the first insulation layer 11B of the first peripheral circuit region P1 are etched using the mask pattern 23 as an etching mask, thereby forming a peripheral circuit gate PG in the first peripheral circuit region P1. The etched second hard mask pattern 20, second conductive layer 19A, first conductive layer 12B, and first insulation layer 11B are indicated by reference numerals 20A, 19B, 12C and 11C, respectively.

When the etching process for forming the peripheral circuit gate PG is performed, a structure of the second peripheral circuit region P2 is etched using the mask pattern 23 as an etching mask, and the second hard mask pattern 20 and the second capping layer 19A, which have been completely exposed by the mask pattern 23, are removed from the second peripheral circuit region P2. However, since parts of the first conductive layer 12B and the first insulation layer 11B have been covered by the capping layer 17A and the second insulation layer 16A, only others not covered by the capping layer 17A and the second insulation layer 16A are removed. In other words, in the above etching process, the capping layer 17A and the second insulation layer 16A serve as an etching barrier for the first conductive layer 12B and the first insulation layer 11B. Meanwhile, the capping layer 17A may be formed of substantially the same material as the first conductive layer 12B and/or the second conductive layer 19A, and thus it may be removed in the etching process of the first conductive layer 12B and/or the etching process of the second conductive layer 19A. As a result of the above process, a resistor R formed of the etched first conductive layer 12C is formed in the second peripheral circuit region P2, and the remaining second insulation layer 16A and the etched first insulation layer 11C are formed on and under the resistor R.

In the above etching process, the insulation layer 22 of the peripheral circuit region P may be partially removed. The insulation layer 22 with a part removed is indicated by reference numeral 22A.

Although not illustrated in the drawing, subsequent processes may be performed, for example, a process for forming spacers at the sidewalls of the peripheral circuit gate PG through insulation layer deposition and blanket etching process, a process for depositing a nitride layer serving as an etching stop layer when a subsequent self-aligned contact (SAC) is formed, a process for forming an interlayer dielectric layer covering the nitride layer, and the like.

According to the fabricating method as described above, the following effects may be achieved.

First, the process for forming the isolation trench and the isolation layer of the cell region and the process for forming the isolation trench and the isolation layer of the peripheral circuit region are separately performed, so that the uniformity in the isolation trench formation process or the isolation layer formation process may be prevented from being reduced due to a loading effect caused by the pattern density difference.

Furthermore, since the gate patterns of the cell region are completed in the process for forming the isolation trench in the peripheral circuit region (refer to FIG. 13), an ion implantation process may be performed simultaneously for forming a junction region in the active region of the cell region and for the active region of the peripheral circuit region, for example, for improving a standby current, so that the process simplification may be achieved and process fails may be reduced.

In addition, when performing the process for allowing the conductive layer for the floating gate to protrude from the isolation layer in the cell region (refer to FIG. 9), since the whole of the peripheral circuit region has been covered by the conductive layer for the floating gate, the process for forming the mask pattern that covers the peripheral circuit region may be omitted, so that the process simplification may be achieved.

Moreover, even when the process for forming the isolation trench and the isolation layer of the cell region and the process for forming the isolation trench and the isolation layer of the peripheral circuit region are separately performed, process steps may not be added. For example, the process for forming the isolation trench of the peripheral circuit region may be performed together with the process for forming the gate patterns of the cell region, and the process for forming the isolation layer of the peripheral circuit region may be performed together with the process for forming the insulation layer filling between the gate patterns of the cell region.

Meanwhile, as the degree of integration of a nonvolatile memory device is increased, it is difficult to form patterns with a desired line width using the conventional photoresist coating, exposure and development processes in the cell region C where patterns are dense and have a small line width. In this regard, so called a spacer patterning technology (SPT) process has been proposed, which has been well known in the art. Hereinafter, the case will be described, in which the gate patterns PG of FIG. 13 are formed using the SPT process in the method for fabricating the nonvolatile memory device in accordance with the embodiment of the present invention.

Figure 17:
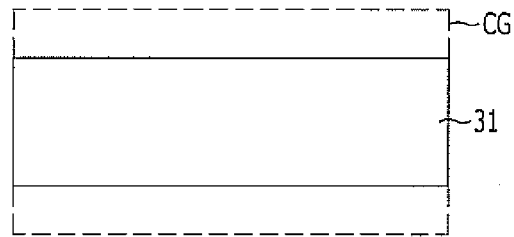
FIGS. 17 to 20 are plan views and cross-sectional views illustrating a method for fabricating a nonvolatile memory device in accordance with another exemplary embodiment of the present invention.
Figure 17:
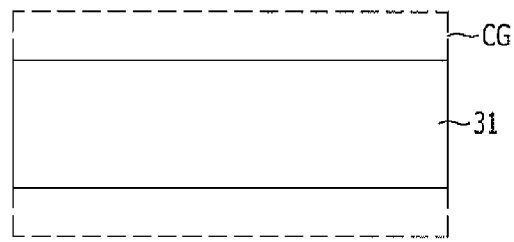
Figure 18:
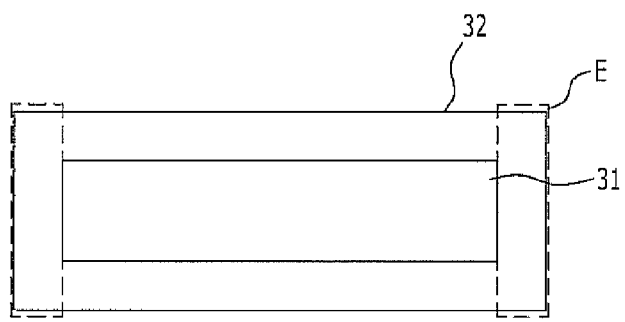
Figure 18:
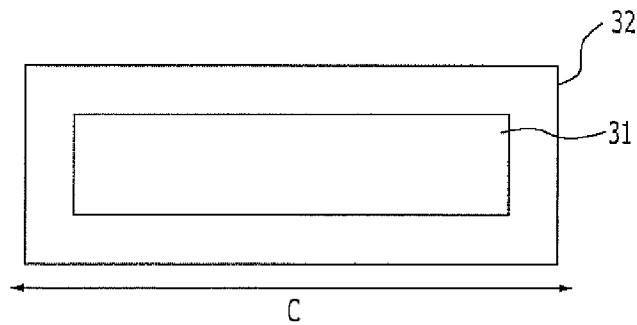
Figure 19:
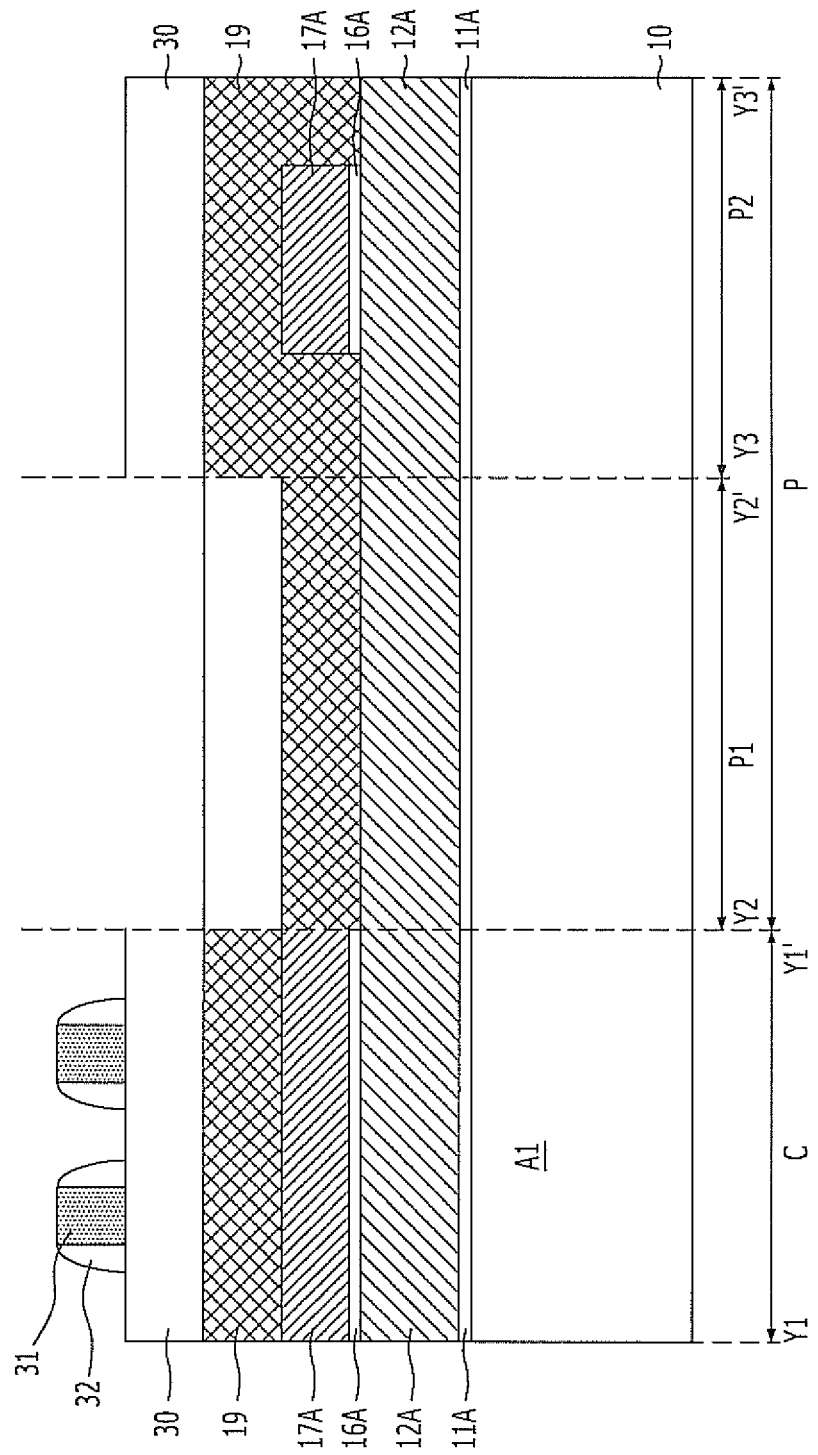
Figure 20:
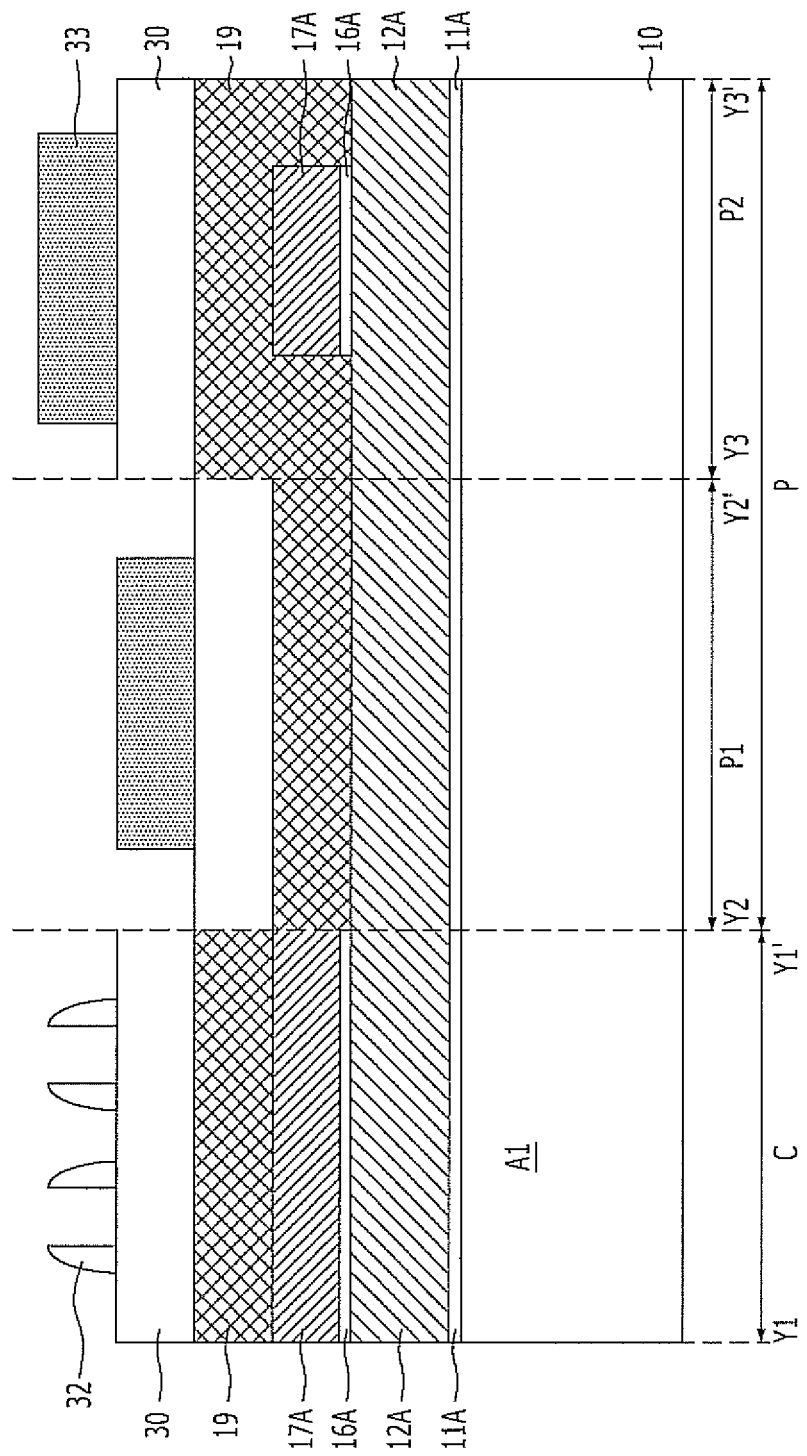

FIGS. 17 to 20 are plan views and cross-sectional views illustrating a method for fabricating a nonvolatile memory device in accordance with another embodiment of the present invention. FIGS. 17 and 18 are plan views illustrating only the cell region C, and FIGS. 19 and 20 are cross-sectional views taken along lines Y1-Y1', Y2-Y2', and Y3-Y3' of FIG. 5. In the description of the exemplary embodiment, description about substantially the same as the above-mentioned embodiment will be briefly given or omitted.

First, the above-mentioned processes of FIGS. 6 to 12 are performed.

Referring to FIGS. 17 and 19, a third hard mask layer 30 such as a nitride layer is formed on the process resultant of FIG. 12, and a mask pattern 31 is formed on the third hard mask layer 30 to alternately cover regions between control gate regions of the cell region C (refer to parts indicated by dotted lines). The mask pattern may be formed through photoresist coating, exposure, and development processes, and it may have a bar shape as illustrated in the drawings.

Referring to FIGS. 18 and 19, an insulation layer for a spacer, for example, an oxide layer or a nitride layer, is deposited on the third hard mask layer 30 and the mask pattern 31 along the surface thereof, and a blanket etching process is performed until the third hard mask layer 30 is exposed, thereby forming spacers 32 at the sidewalls of the mask pattern 31 of the cell region C. In such a blanket etching process, the insulation layer formed in the peripheral circuit region P is removed.

Referring to FIG. 20, the mask pattern 31 is removed to allow only the spacer 32 to remain in the cell region C. The mask pattern 31 may be easily removed by a strip process using $O_2$ plasma.

A mask pattern 33 is formed on the third hard mask layer 30 of the peripheral circuit region P to expose an isolation region of the first and second peripheral circuit regions P1 and P2.

Although not illustrated in the drawing, a lower structure is etched using the spacer 32 of the cell region C and the mask pattern 33 of the peripheral circuit region P as an etching barrier. In other words, the spacer 32 of the cell region C and the mask pattern 33 of the peripheral circuit region P perform substantially the same function as the mask pattern 21 of FIG. 13, and the third hard mask layer 30 performs substantially the same function as the second hard mask layer of FIG. 13.

Thus, a structure substantially similar to that illustrated in FIG. 13 may be achieved, that is, the gate patterns are formed in the cell region C and the isolation trenches T2 and T3 are formed in the first and second peripheral circuit regions P1 and P2. However, the gate patterns of the cell region C of this embodiment do not have a line shape, but have a frame shape in which the line patterns are connected to each other at the edges (refer to E of FIG. 18) of the cell region C, differently from FIG. 13. This is because the mask pattern 31 has a bar shape, the spacer 32 has a frame shape for surrounding all sidewalls of the mask pattern 31, and thus the gate pattern of the cell region C etched using the spacer 32 also has a frame shape. Accordingly, in order to form a line-type gate pattern G1 in the cell region C as illustrated in FIGS. 5 and 13, the gate patterns of the edges (refer to E of FIG. 18) of the cell region C may be removed, thereby dividing one frame structure into two line structures, which will be described below.

When the gate pattern of the cell region C is formed using the spacer 32 as described above, the width of the gate pattern of the cell region C may be reduced by overcoming the exposure limitation, resulting in an increase in the degree of integration of the cell region C. This is because the width of the spacer 32 may be adjusted to be very small by adjusting the thickness of the insulation layer for a spacer.

Subsequent processes are substantially the same as the processes described in FIGS. 14 to 16. The above-mentioned process for removing the gate patterns from the edges E of the cell region C may further performed, and thus the processes of FIGS. 15 and 16 may be partially changed. However, since the edges E of the cell region C are not illustrated in FIGS. 15 and 16, the subsequent processes may also be illustrated in FIGS. 14 to 16.

In detail, in the process of FIG. 15, the mask pattern 23 covers the cell region C while exposing the edges E of the cell region C. In the process of FIG. 16, the peripheral circuit gate PG is formed in the first peripheral circuit region P1 and the resistor R is formed in the second peripheral circuit region P2 by using the mask pattern 23, and the gate pattern at the edges E of the cell region C is removed to obtain the line-type gate pattern.

In accordance with the fabricating method according to another exemplary embodiment of the present invention as described above, the substantially same effective result as that from the above-mentioned embodiment may be achieved.

In addition, the gate pattern of the cell region is formed using the SPT process, so that the gate pattern may be formed beyond the exposure limitation, resulting in a significant increase in the degree of integration of the cell region.

Moreover, the gate pattern division process at the edges of the cell region due to the SPT process is performed together with the process for forming the gate and resistor of the peripheral circuit region, so that an additional process is not required.

In accordance with a method for fabricating a nonvolatile memory device according to the present invention, uniformity in process may be ensured, thereby reducing the process time, cost, difficulty, and fails.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a nonvolatile memory device, comprising:
    forming a first insulation layer and a first conductive layer on a substrate including a first region and a second region;
    forming a first isolation trench in the first region by selectively etching the first conductive layer, the first insulation layer, and the substrate of the first region;
    forming a first isolation layer filled in the first isolation trench;
    forming a second insulation layer and a conductive capping layer on the first isolation layer and the first conductive layer;
    etching the capping layer and the second insulation layer of the second region;
    forming a second conductive layer on a resultant structure; and
    forming first gate patterns by selectively etching the second conductive layer, the capping layer, the second insulation layer, the first conductive layer, and the first insulation layer of the first region while forming a second isolation trench in the second region by selectively etching the second conductive layer, the first conductive layer, the first insulation layer, and the substrate of the second region,
    wherein the forming of the second isolation trench is performed after the forming of the first isolation trench,
    wherein the first region and the second region do not overlap with each other so that the first isolation trench of the first region does not overlap with the second isolation trench of the second region, and
    wherein the forming of the first gate patterns and the forming of the second isolation trench are completed at the same time.

2. The method of claim 1, further, after the forming of the first isolation layer, comprising:
    removing a part of the first isolation layer, wherein the first conductive layer of the first region protrudes from the first isolation layer.

3. The method of claim 2, wherein the part of the first isolation layer is removed using etch selectivity of the first isolation layer to the first conductive layer.

4. The method of claim 1, further, after the forming of the second isolation trench, comprising:
    forming a third insulation layer that fills between the first gate patterns of the first region while filling a whole or a part of the second isolation trench.

5. The method of claim 1, wherein, in the etching of the capping layer and the second insulation layer, the capping layer and the second insulation layer are removed from the second region.

6. The method of claim 5, further, after the forming of the second isolation trench, comprising:
    forming second gate patterns in the second region by selectively etching the second conductive layer, the first conductive layer, and the first insulation layer of the second region.

7. The method of claim 6, wherein the forming of the first gate patterns comprises:
    forming a first mask pattern on the second conductive layer to alternately cover regions of the second conductive layer between regions where a control gate of the first region is to be formed;

forming a spacer at a sidewall of the first mask pattern;
removing the first mask pattern; and
forming the first gate patterns by performing an etching process using the spacer.

8. The method of claim 7, further, after the forming of the first gate patterns and the forming of the second isolation trench, comprising:
forming the second gate patterns while removing the first gate patterns from edges of the first region.

9. The method of claim 1, wherein, in the etching of the capping layer and the second insulation layer, the capping layer and the second insulation layer are selectively etched and positioned in an active region of the second region.

10. The method of claim 9, further, after the forming of the second isolation trench, comprising:
forming a resistor by removing the second conductive layer of the second region and selectively etching the first conductive layer and the first insulation layer of the second region using the etched capping layer and the etched second insulation layer as an etching barrier.

11. The method of claim 10, wherein the forming of the first gate patterns comprises:
forming a first mask pattern on the second conductive layer to alternately cover regions of the second conductive layer between regions where a control gate of the first region is to be formed;
forming a spacer at a sidewall of the first mask pattern;
removing the first mask pattern; and
forming the first gate patterns by performing an etching process using the spacer.

12. The method of claim 11, further, after the forming of the first gate patterns and the forming of the second isolation trench, comprising:
forming the resistor while removing the first gate patterns from edges of the first region.

13. A method for fabricating a nonvolatile memory device, comprising:
forming a first insulation layer for a tunnel insulation layer and a first conductive layer for a floating gate on a substrate including a cell region, a first peripheral circuit region, and a second peripheral circuit region;
forming a first isolation trench in the cell region by selectively etching the first conductive layer, the first insulation layer, and the substrate of the cell region;
forming a first isolation layer filled in the first isolation trench;
forming a second insulation layer for a charge blocking layer and a conductive capping layer on the first isolation layer and the first conductive layer;
removing the capping layer and the second insulation layer of the first peripheral circuit region, while patterning the capping layer and the second insulation layer of the second peripheral circuit region to be positioned in an active region;
forming a second conductive layer for a control gate on a resultant structure; and
forming first gate patterns by selectively etching the second conductive layer, the capping layer, the second insulation layer, the first conductive layer, and the first insulation layer of the cell region while forming second isolation trenches in the first and second peripheral circuit regions by selectively etching the second conductive layer, the first conductive layer, the first insulation layer, and the substrate of the first and second peripheral circuit regions,
wherein the forming of the second isolation trench is performed after the forming of the first isolation trench,
wherein the cell region, the first peripheral circuit region, and the second peripheral circuit region do not overlap with one another so that the first isolation trench of the cell region does not overlap with the second isolation trenches of the first and second peripheral circuit regions, and
wherein the forming of the first gate patterns and the forming of the second isolation trench are completed at the same time.

14. The method of claim 13, further, after the forming of the first isolation layer, comprising:
removing a part of the first isolation layer, wherein the first conductive layer of the cell region protrudes from the first isolation layer.

15. The method of claim 14, wherein the part of the first isolation layer is removed using etch selectivity of the first isolation layer to the first conductive layer.

16. The method of claim 13, further, after the forming of the second isolation trench, comprising:
forming a third insulation layer that fills between the first gate patterns of the cell region while filling a whole or a part of the second isolation trench.

17. The method of claim 13, further, after the forming of the second isolation trench, comprising:
forming second gate patterns by selectively etching the second conductive layer, the first conductive layer, and the first insulation layer of the first peripheral circuit region, and forming a resistor by removing the second conductive layer of the second peripheral circuit region and selectively etching the first conductive layer and the first insulation layer of the second peripheral circuit region using the patterned capping layer and the patterned second insulation layer as a etching barrier.

18. The method of claim 13, wherein the forming of the first gate patterns comprises:
forming a first mask pattern on the second conductive layer to alternately cover regions of second conductive layer between regions where a control gate of the cell region is to be formed;
forming a spacer at a sidewall of the first mask pattern;
removing the first mask pattern; and
forming the first gate patterns by performing an etching process using the spacer.

19. The method of claim 18, further comprising:
after the forming of the first gate patterns and the forming of the second isolation trench, forming second gate patterns by selectively etching the second conductive layer, the first conductive layer, and the first insulation layer of the first peripheral circuit region, forming a resistor by removing the second conductive layer of the second peripheral circuit region and selectively etching the first conductive layer and the first insulation layer of the second peripheral circuit using the patterned capping layer and the patterned second insulation layer as a etching barrier, and removing the first gate patterns from edges of the cell region.

20. A method for fabricating a nonvolatile memory device, comprising:
forming a first insulation layer and a first conductive layer on a substrate including a first region and a second region;
forming a first isolation layer in the substrate of the first regions;
forming a second insulation layer and a conductive capping layer on the first isolation layer and the first conductive layer;

etching the capping layer and the second insulation layer of the second region;

forming a second conductive layer on a resultant structure; and forming first gate patterns in the first region and a second isolation trench in the second region by selectively etching the second conductive layer, the capping layer, the second insulation layer, the first conductive layer, and the first insulation layer of the first region and the second conductive layer, the first conductive layer, the first insulation layer, and the substrate of the second region, wherein the forming of the second isolation trench is performed after the forming of the first isolation layer, wherein the first region and the second region do not overlap with each other so that the first isolation layer of the first region does not overlap with the second isolation trench of the second region, and wherein the forming of the first gate patterns and the forming of the second isolation trench are completed at the same time.

21. The method of claim 20, wherein, in the etching of the capping layer and the second insulation layer, the capping layer and the second insulation layer are removed from a third region of the second region and patterned in a fourth region of the second region.

22. The method of claim 21, further comprising:

after the forming of the second isolation trench, forming second gate patterns in the third region and a resistor in a fourth region by selectively etching the second conductive layer, the first conductive layer, and the first insulation layer of the third region and by removing the second conductive layer of the fourth region and selectively etching the first conductive layer and the first insulation layer of the fourth region using the patterned capping layer and the patterned second insulation layer as a etching barrier.

* * * * *